US005086412A

United States Patent [19]

Jaffe et al.

[11] Patent Number: 5,086,412
[45] Date of Patent: Feb. 4, 1992

[54] SENSE AMPLIFIER AND METHOD FOR FERROELECTRIC MEMORY

[75] Inventors: James M. Jaffe, Santa Clara; Norman E. Abt, Burlingame, both of Calif.

[73] Assignee: National Semiconductor Corporation, Santa Clara, Calif.

[21] Appl. No.: 616,605

[22] Filed: Nov. 21, 1990

[51] Int. Cl.$^5$ .............................................. G11C 11/22
[52] U.S. Cl. ...................................... 365/145; 365/65; 365/189.06; 307/353
[58] Field of Search ..................... 365/145, 65, 189.06; 307/353

[56] References Cited

U.S. PATENT DOCUMENTS 3,651,494  3/1972  Lynch et al. ...................... 365/145
4,888,733  12/1989  Mobley ............................... 365/145

Primary Examiner—Joseph E. Clawson, Jr.
Attorney, Agent, or Firm—Flehr, Hohbach, Test, Albritton & Herbert

[57] ABSTRACT

A ferroelectric random access memory device contains columns of ferroelectric memory cells, each column of memory cells being coupled to a distinct bit line. Each memory cell is selectively coupled to a corresponding bit line by an access control transistor so that only one memory cell in the column is coupled to the bit line at a time. To read the data stored in a selected memory cell reads, the cell is strobed twice, separately sampling the output voltage generated each time. Since the first read is a destructive read, the second read operation always reads the cell in its "0" state. Then the two sampled outputs are compared, and if the first reading exceeds the second by at least a threshold amount then a "1" output value is generated. Otherwise a "0" is the output value. In a preferred embodiment, the time delay between strobing the memory cell and sampling its output is made longer the first time that the cell is read than for the second time that the cell is read. In this way, if the cell is storing a "0" bit, the first read will produce an output voltage that is smaller than it would have been had the first read not been delayed, which helps to ensure that cells storing "0" bit values are properly sensed.

11 Claims, 5 Drawing Sheets

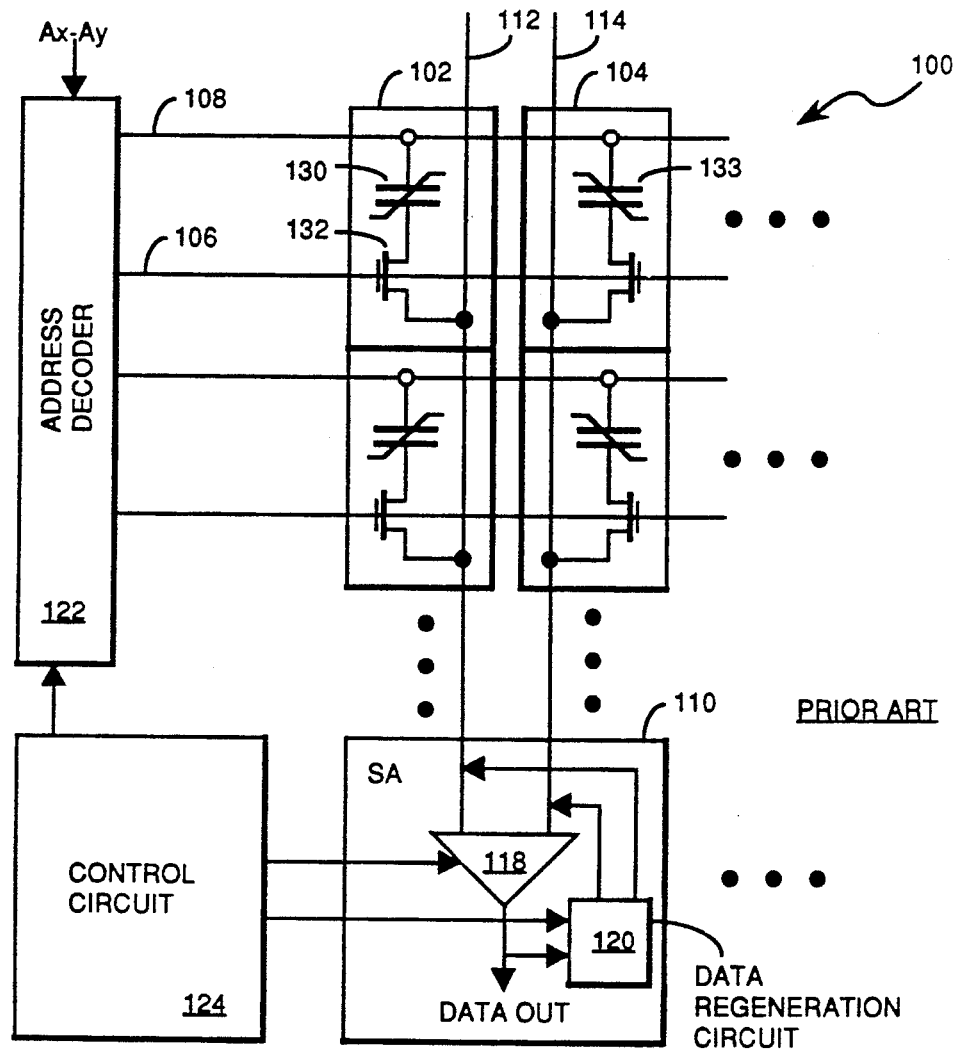
FIGURE 1
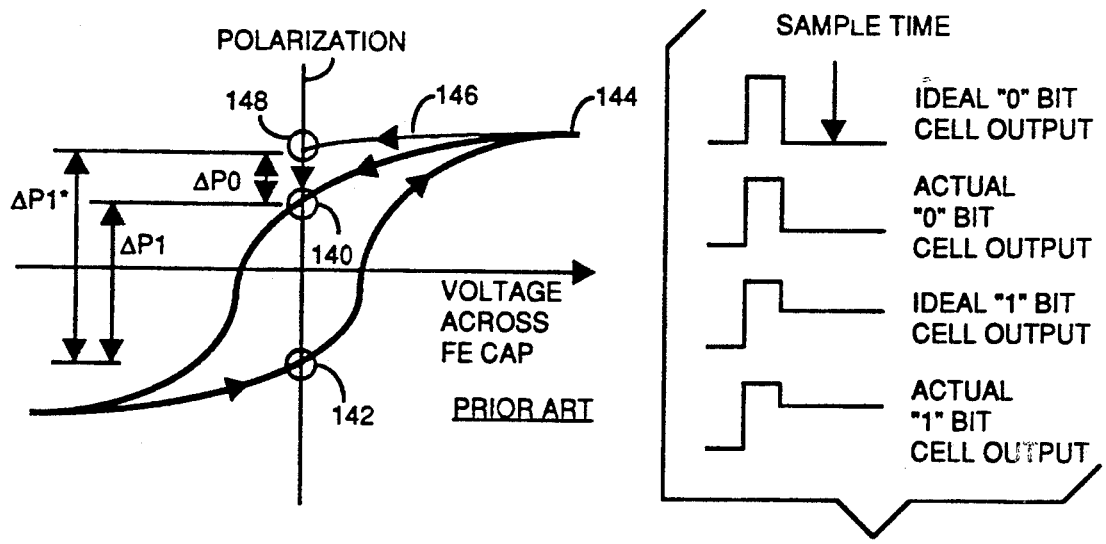
FIGURE 2   FIGURE 3

SENSE AMPLIFIER AND METHOD FOR FERROELECTRIC MEMORY

The present invention relates generally to semiconductor ferroelectric memory devices, and particularly to sense amplifiers used to read data stored in arrays of ferroelectric memory cells.

BACKGROUND OF THE INVENTION

Most prior art ferroelectric memory devices, such as the memory device 100 shown in FIG. 1, store a single bit of information in a pair of cells 102, 104, each in a different state. For example, a "1" bit may be represented by storing an "up" polarization in ferroelectric capacitor 130 of cell 102 and storing a "down" polarization in ferroelectric capacitor 133 of cell 104. The pair of cells 102-104 is read by enabling word line 106 and then sending a pulse on drive line 108. A sense amplifier 110 at the end of bit lines 112-114 detects the difference between the voltages on the two bit lines, and amplifies that difference using a cross-coupled amplifier 118 to generate a data out signal.

Since each read operation destroys the data stored in the cells 102-104, a data regeneration circuit 120 is used to rewrite that data back into the cells. More particularly, the read operation puts both cells 102-104 in the "0" state, and a "1" state is restored in one of the two cells by asserting a high voltage (e.g., 5 volts) signal on the corresponding bit line 112 or 114 and a low voltage (e.g., zero volts) on drive line 108.

Other aspects of the memory device include a word line address decoder 122 which decodes a portion of the incoming address signals into word line selection signals, and a control circuit 124 which controls the timing of various clock signals required for operating the memory device.

As shown in FIG. 1, each cell 102 contains a ferroelectric capacitor 130 and an MOS access control transistor 132. FIG. 2 shows the hysteresis curve (showing the relationship between polarization and electric field) associated with a typical ferroelectric capacitor. As will be understood by those skilled in the art, this hysteresis curve is generated using a "Sawyer-Tower" circuit. For illustrative purposes we shall define that when the cell is in the "0" state, the polarization state of the ferroelectric capacitor is located at point 140 and when it is in the "1" state its polarizatoin state is located at point 142 in FIG. 2.

When a read pulse is asserted on the cell's drive line 108, if the cell is the "1" state, the polarization of its ferroelectric capacitor will move counterclockwise up the right side of the hysteresis curve to the peak 144 while the pulse is at its peak, and then when the pulse ends, the ferroelectric capacitor will move to point 140. If the cell is in the "0" state when the read pulse is asserted, the polarization of the capacitor will move back up toward the peak 144 and then back to point 140 after the pulse ends. Changes in the polarization state of the cell's ferroelectric capacitor generate voltage changes on the cell's bit line by capacitive division with the bit line's parasitic capacitance.

Thus, as shown in FIG. 3, if the cell is in a "1" state, the read pulse "should" cause the output voltage of the cell to increase by an amount proportional to $\Delta P1$ (i.e., the polarization difference between positions 140 and 142). If the cell is in a "0" state, the read pulse "should" not cause the cell's bit line voltage to change at all.

Unfortunately, the actual voltage characteristics of ferroelectric change at all. Unfortunately, the actual voltage characteristics of ferroelectric cells are different from the "ideal" hysteresis curve shown in FIG. 2. When the ferroelectric capacitor is first released from point 144, it actually follows path 146 to a point 148, and from there it relaxes back to point 140 over a period of time, which varies somewhat unpredictably from device to device, but will typically take somewhere between 100 nanoseconds and 1 millisecond.

The net result of all this is that when a ferroelectric cell in the "0" state is read, it produces a net voltage output proportional to $\Delta P0$ (i.e., the polarization difference between positions 148 and 140) if the output of the cell is read quickly (e.g., within ten or twenty nanoseconds of the time that the cell is pulsed). This presents a problem for the prior art memory device shown in FIG. 1 in that the signal differential between the two bit lines will be less than expected. However, if the two cells 102-104 could be relied upon to have identical device characteristics, this problem would not be significant.

Unfortunately, it is a well known fact that the device characteristics of ferroelectric cells vary considerably even though the cells are formed on the same monolithic integrated circuit. In particular, the shape of the hysteresis curves of cells changes over time, and changes somewhat based on the voltage stored in the cells over time. Since the two complementary cells used in prior art devices store opposite data, the two cells will age differently and their device characteristics become more and more different over time. In a certain percentage of cell pairs, the voltage corresponding to $\Delta P0$ of one cell will equal or exceed the voltage corresponding to $\Delta P1^*$ (i.e., the polarization difference between positions 148 and 142) of the other cell, thereby causing the sense amplifier to misread the stored data. This problem is particularly insidious because it typically does not show up until the memory device has been in operation for a period of time, such as a year, making it difficult to avoid through the use of device testing procedures. The problem is also difficult to solve because it is a statistical phenomenon with a high enough rate of occurrence that it makes it virtually impossible to make reliable high density memory devices with, say, over a few thousand bits per device (although future improvements in the materials used to manufacture such cells may lessen these problems).

In summary, prior art ferroelectric memory devices such as the one shown in FIG. 1 have the problem that the two cells used to store each bit of data age differently and have different hysteresis curves, making data sensing unreliable. The voltage output by one cell in a "0" state can actually exceed the voltage output by another cell in the "1" state. Furthermore, the prior art devices use two cells to store a single bit of data, which is not space efficient.

SUMMARY OF THE INVENTION

The present invention overcomes the problems associated with dual cell ferroelectric memory devices by (1) using a single cell with a self-referencing voltage comparison scheme for sensing the data state of each cell, and (2) by controlling the timing of the signals used to read a cell so as to minimize the effect of the decaying $\Delta P0$ problem. Furthermore, by using a single cell for each bit of data instead of two cells, memory density is improved by a factor of two.

More specifically, a ferroelectric memory device in accordance with the present invention reads each cell twice, separately sampling the output voltage generated each time. Since the first read is a destructive read, the second read operation always reads the cell in its "0" state. Then the two sampled outputs are compared, and if the first reading exceeds the second by at least a threshold amount (e.g., by more than the voltage corresponding to $\Delta P0$), then a "1" output value is generated. Otherwise a "0" is the output value.

A second aspect of the present invention is that the time delay between strobing the memory cell and sampling its output is made longer the first time that the cell is read than for the second time that the cell is read. In this way, if the cell is storing a "0" bit, the first read will produce an output voltage that is smaller than it would have been had the first read not been delayed, which will help ensure that a "0" bit value is sensed properly. If the cell is storing a "1" bit, the bit line voltage corresponding to $\Delta P1$ will still exceed the reference voltage from the second read, so the reading of "1" bits is not adversely affected by this timing scheme.

Further, while the reading of "1" bits is a problem with the prior art memory device due to the variability of the voltage corresponding to $\Delta P0$, the reading of "1" bits is very reliable using the self referencing scheme of the present invention.

BRIEF DESCRIPTION OF THE DRAWINGS

Additional objects and features of the invention will be more readily apparent from the following detailed description and appended claims when taken in conjunction with the drawings, in which:

FIG. 1 is a block diagram of a prior art array of ferroelectric memory cells with a sense amplifier.

FIG. 2 depicts a hysteresis loop for a ferroelectric memory cell.

FIG. 3 compares the output voltages generated when reading an ideal ferroelectric memory cell with the output voltages generated when reading a real ferroelectric memory cell.

DESCRIPTION OF THE PREFERRED EMBODIMENT

Figure 4:
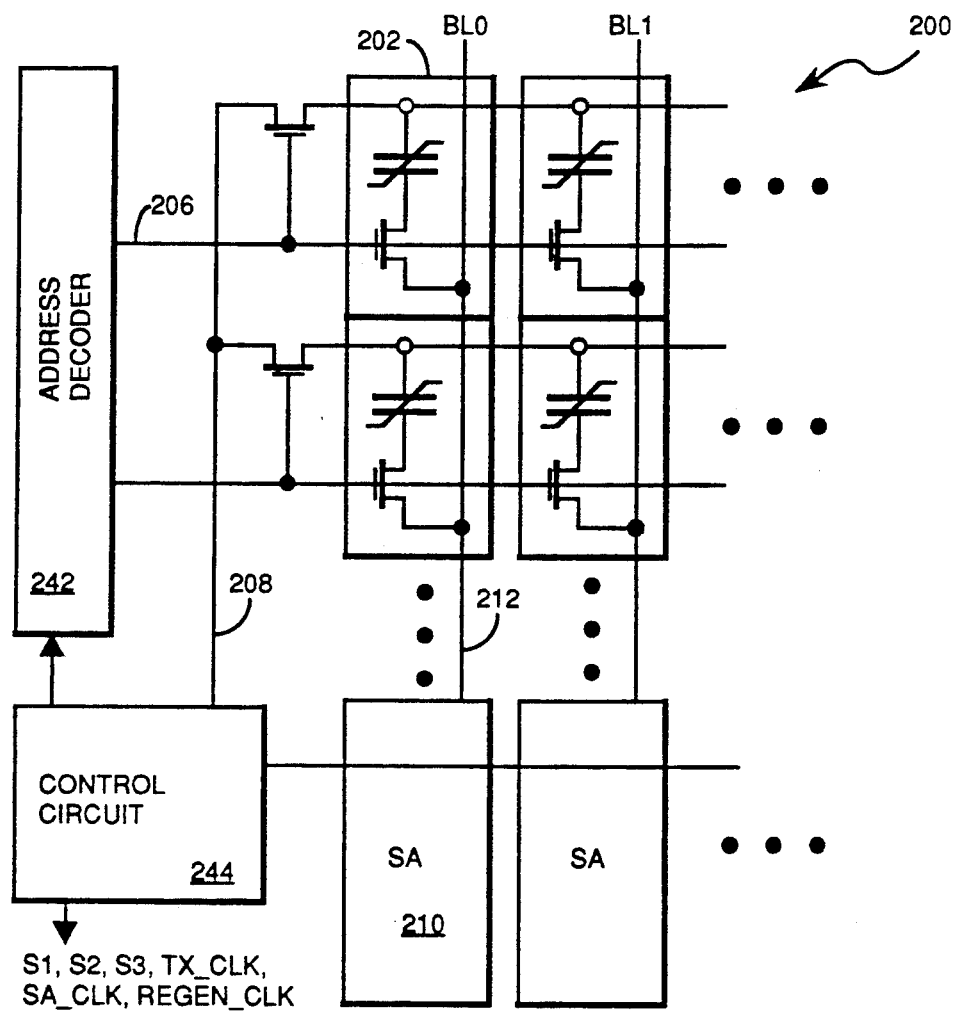
FIG. 4 is a block diagram of an array of ferroelectric memory cells with sense amplifiers in accordance with the present invention.

Referring to FIG. 4, there is shown a ferroelectric memory device 200 in accordance with the present invention. The memory device contains an array of ferroelectric memory cells 202, each of which is essentially the same as the cell 102 in the prior art device, except that only one cell is required to store a bit of data. A memory cell 202 is selected for access by enabling word line 206 and is then read by sending a pulse or strobe signal on drive line 208.

Figure 5:
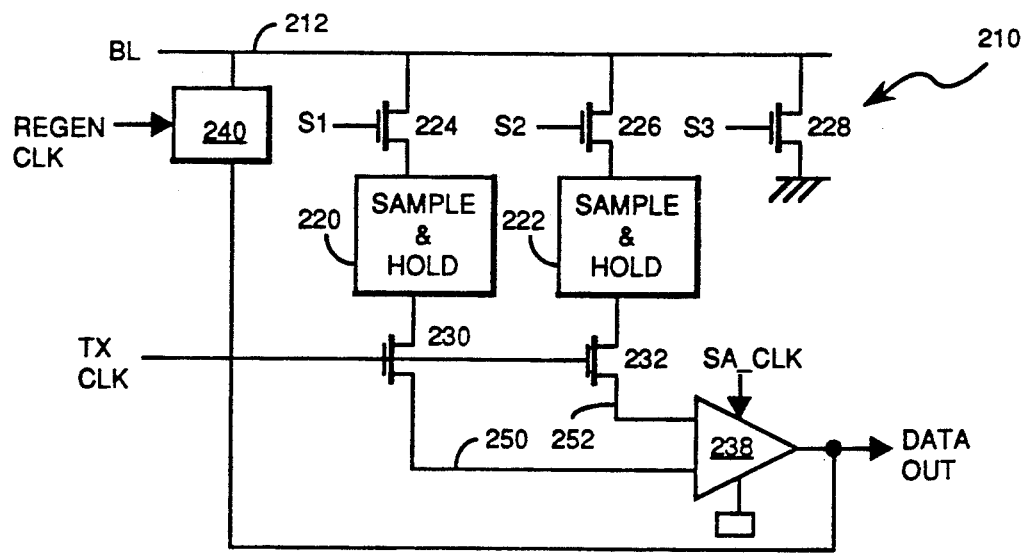
FIG. 5 is a block diagram of a sense amplifier in accordance with the present invention.

Referring to FIGS. 4 and 5, there is a sense amplifier 210 at the end of each bit line 212. The sense amplifier 210 contains first and second sample and hold circuits 220 and 222, each having its own input control transistor 224, 226, and its own output gating transistor 230 and 232. The outputs from the two sample and hold circuits 220-222 are coupled by gating transistors 230-232 to the inputs of a cross-coupled differential amplifier 238, which generates a data out signal. There is also a separate transistor 228 for grounding the bit line between cell access operations.

As in the prior art ferroelectric memory device of FIG. 1, a data regeneration circuit 240 is used to rewrite data back into the cell 202 after the data from the cell has been read and thereby destroyed, and a word line address decoder 242 decodes a portion of the incoming address signals into word line selection signals. There is also a control circuit 244 which generates a sequence of timing signals, herein called DATA STROBE, S1, S2, S3, TX_CLK and SA_CLK, required for operating the memory array 200 and sense amplifier 210 of the preferred embodiment.

Figure 6:
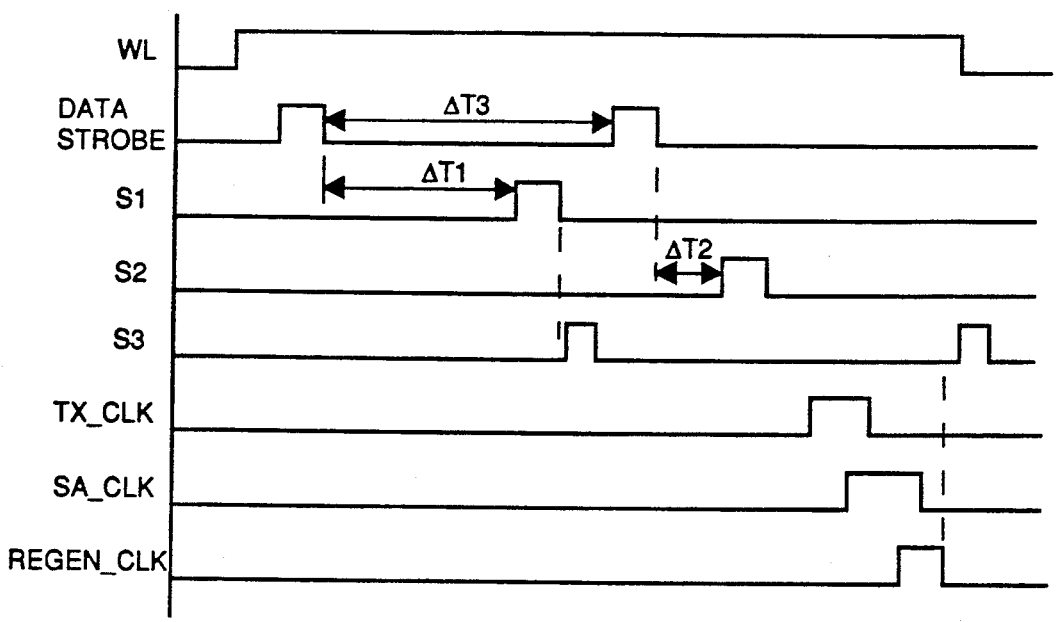
FIG. 6 is a timing diagram related to use the sense amplifier shown in FIG. 5.
Figure 8:
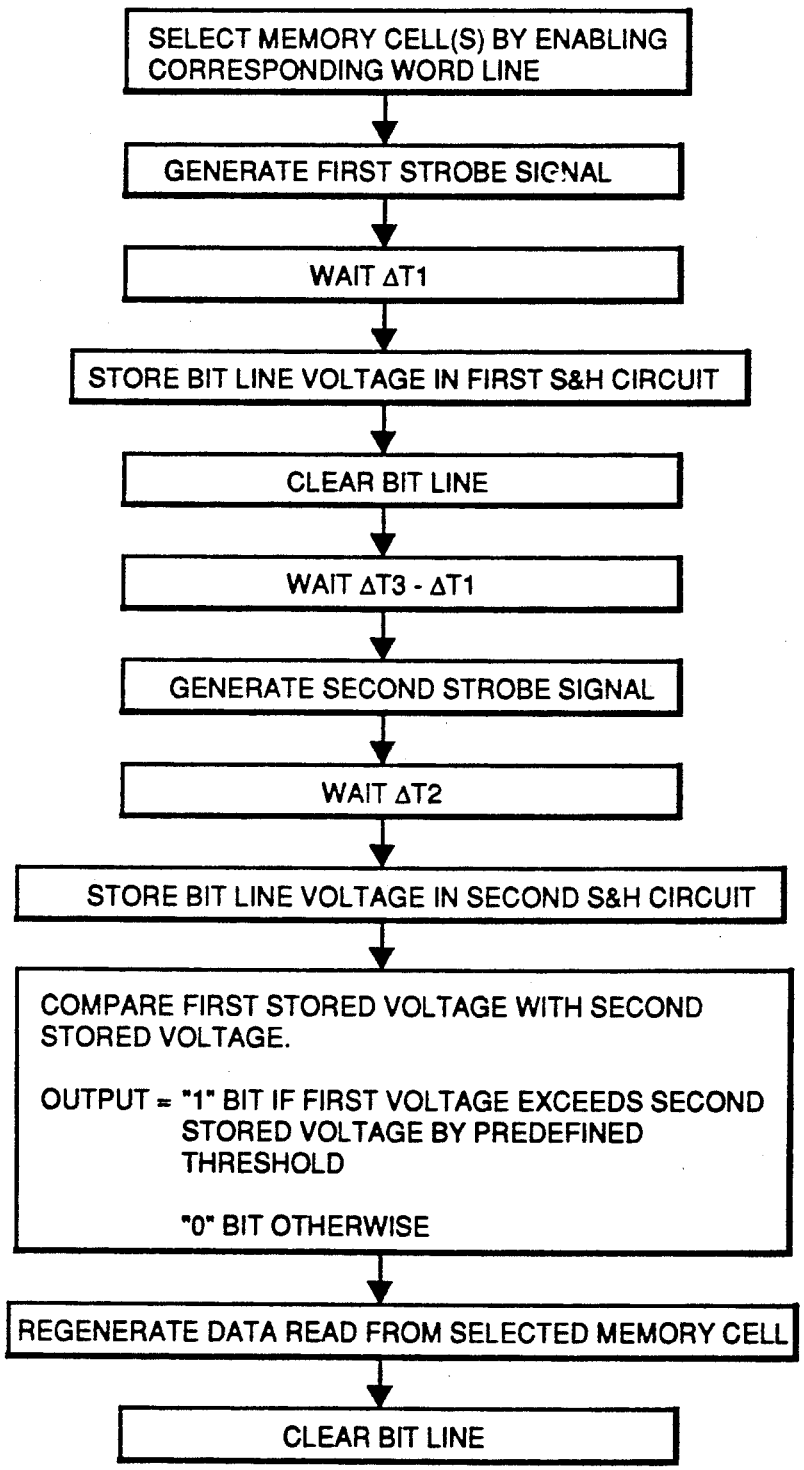
FIG. 8 is a flow chart of the preferred embodiment of the method of the present invention.

Referring to FIGS. 5, 6 and 8, the sense amplifier 210 detects the data stored in the selected cell 202 as follows. First, the address decoder 242 generates a word line signal on one of the word lines 206, thereby selecting one memory cell on each bit line 212. A first DATA STROBE, which is a positive going pulse, is asserted on the driver line 208. This puts a voltage signal on the bit line 212 that is indicative of the data stored in the selected memory cell 202. This voltage is sampled by enabling signal S1, which closes transistor 224 and causes the first sample and hold circuit 220 to sample and hold the voltage on the bit line. Then S3 is asserted so as to return the bit line 212 to a known voltage (ground potential in the preferred embodiment), thereby removing charge from the first pulsing of the cell.

Next, a second DATA STROBE is asserted on the driver line 208. This puts a reference voltage signal on the bit line 212 that is indicative of the voltage associated with the selected memory cell 202. This voltage is sampled by enabling signal S2, which closes transistor 226 and causes the second sample and hold circuit 222 to sample and hold the voltage on the bit line.

After the two voltage signals have been stored in sample and hold circuits 220 and 222, the TX_CLK is enabled to as to pass these voltage values to differential amplifier 238. Shortly after TX_CLK is enabled, the sense amplifier clock SA_CLK is enabled, which causes the amplifier to amplify the voltage differential on lines 250 and 252 and to generate an output signal indicative of the data stored in the selected cell. The REGEN_CLK is then enabled after the amplifier 238 has done its work, enabling the data regeneration circuit 240 to rewrite the read data value back into the selected memory cell. Finally, S3 is asserted a second time so as to return the bit line 212 to a known voltage (ground potential in the preferred embodiment) in preparation for the next memory access cycle.

Figure 7:
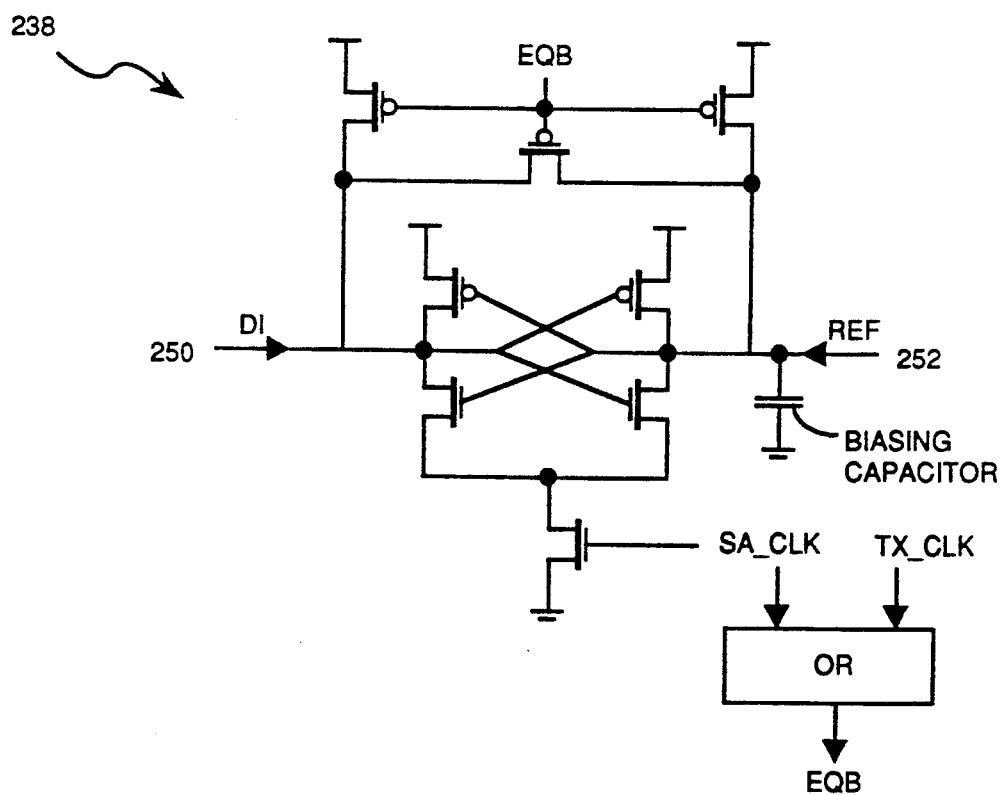
FIG. 7 depicts a preferred embodiment of an amplifier useable in the sense amplifier of FIG. 5.

The amplifier 238 is more properly described as a comparator which generates a high voltage if the voltage on line 250 (i.e., the voltage generated by the first strobing of the selected memory cell) exceeds the voltage on line 252 (i.e., the reference voltage generated by the second strobing of the selected memory cell) by at least a threshold value. More particularly, the amplifier 238 is biased or imbalanced so that the voltage held in sample and hold circuit 220 for a cell storing a "0" bit will not be inadvertently read as a "1" bit. As will be understood by those skilled in the art, this imbalance can be generated either with a small biasing voltage, a small capacitor on one side of the sense amplifier, or by using different size transistors on the two sides of the amplifier. A preferred embodiment of this amplifier 238 is shown in FIG. 7. The "biasing capacitor" in this circuit adds a predefined amount of charge to the reference side of the amplifier, approximating the required threshold for ensuing that a "0" is not read as a "1".

Referring to FIG. 2, it can be seen that when a cell storing a "0" bit is first read, a fairly large voltage (representative of $\Delta P0$) may be stored in the first sample and hold circuit 220. The second strobing of the memory cell will typically occur well before the voltage of the ferroelectric capacitor in the cell has recovered to point 140 in the hysteresis curve. Therefore, depending on how quickly the ferroelectric capacitor recovers from position 148 in the hysteresis curve and the relative timings of the various control signals used to strobe the cell and sample its outputs, the reference voltage (corresponding to $\Delta P0$) generated during the second strobing of the cell may well be smaller than the voltage generated during the first strobing of the cell. As a result, there is strong likelihood that a straight, unbiased, voltage comparison of the two stored voltages would work incorrectly when reading a "0" bit.

The present invention uses two technique to solve this potential problem. First, as stated above, the amplifier 238 is biased or imbalanced so that the voltage on line 250 from the first sampling of the bit line must exceed the reference voltage on line 252 by at least a predefined margin in order for the amplifier to generate a "1" data output value. Thus the voltage held in sample and hold circuit 220 for a cell storing a "0" bit will not be inadvertently read as a "1" bit.

Referring to the timing diagram of FIG. 6, a second technique is used in the preferred embodiment to further reduce the potential for an erroneous reading of a cell holding a "0" bit. In particular, the elapsed time $\Delta T1$ between the first data strobe signal and the first sampling of the bit line is made much longer than the elapsed time $\Delta T2$ between the second data strobe signal and the second sampling of the bit line. Looking at the hysteresis curve of FIG. 2, one can see that lengthening $\Delta T1$ relative to $\Delta T2$ reduces the voltage (representative of $\Delta P0$) for the first sample and hold, and also increases the voltage for the second ($\Delta P0$ reference) sample and hold. $\Delta T2$ will typically be made as short as possible so as to make the access time of the memory device as fast as possible. Thus the selection of $\Delta T1$ is a compromise between fast access time and ensuring that a "0" is not read as a "1."

$\Delta T3$ represents the time delay between data strobes. Making $\Delta T3$ long compared to $\Delta T2$ also helps to increase the size of the reference voltage, which makes the comparison of the two sampled voltages easier to accomplish in an error free fashion. However, in most implementations it is expected that the second data strobe will be generated as soon as the first sampling of the bit line has been accomplished, making $\Delta T3$ only slightly longer than $\Delta T1$.

The inventors' preferred guidelines for setting relative values of $\Delta T1$, $\Delta T2$ and $\Delta T3$ are as follows: $10*\Delta T2 > \Delta T1 > 2*\Delta T2$ (i.e., $\Delta T1$ is preferably between two and ten times as long as $\Delta T2$). Due to practical considerations, particularly the need for fast access times, $\Delta T1$ should generally be between three and five times as long as $\Delta T2$.

ALTERNATIVE EMBODIMENTS

Figure 9A:
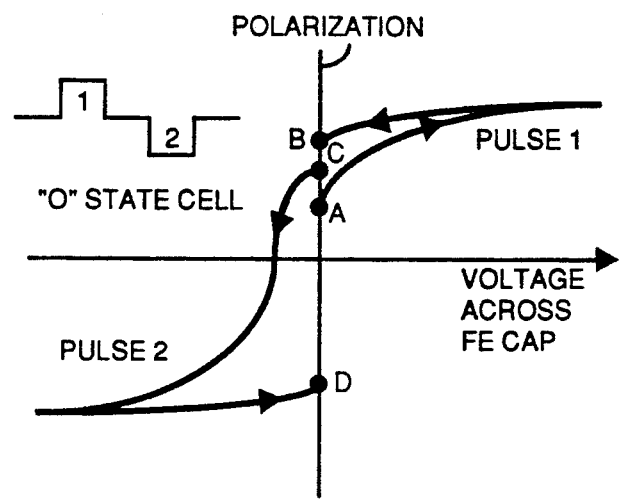
FIGS. 9A and 9B depicts hysteresis loops associated with an alternate embodiment of the present invention.
Figure 9B:
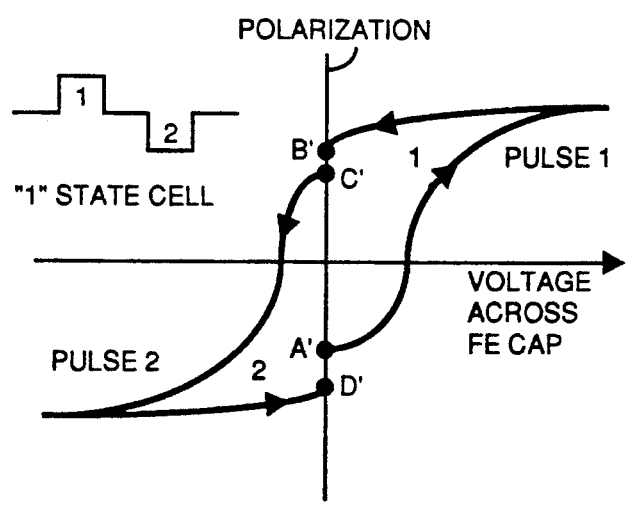

In the preferred embodiment, described above, each cell read cycle requires the cell to be strobed with two upward going pulses (see data strobe signal in FIG. 6). Referring to FIGS. 9A and 9B, in an alternate embodiment, the ferroelectric cell is strobed first with an up pulse and then with a down pulse. In this alternate embodiment the cell and other circuitry described above is unchanged, except for a small change to the sense amplifier which will be described below.

If the cell being read is storing a "0", the reaction of the cell to the two data strobe pulses is shown in FIG. 9A. The first pulse causes the polarization of the ferroelectric capacitor in the cell to move from position A to position B, and then to decay over time back toward position A. This generates a small positive voltage on the bit line equal to Voltage(C)−Voltage(A).

This voltage, which corresponds to position C (the exact position of which depends on how long one waits after the first pulse) is sampled and held in S&H 220 of FIG. 5. The second pulse causes the polarization of the ferroelectric capacitor in the cell to move from position C to position D, generating a much larger negative voltage (equal to the voltage at D minus the voltage at C) on the bit line which is stored in S&H 222.

If the cell being read is storing a "1," the reaction of the cell to the two data strobe pulses is shown in FIG. 9B. The first pulse causes the polarization of the ferroelectric capacitor in the cell to move from position A' to position B', and then to decay to position C'. This generates a positive voltage on the bit line of Voltage(C')−Voltage(A')

which is sampled and held in S&H 220 of FIG. 5. The second pulse causes the polarization of the ferroelectric capacitor in the cell to move from position C' to position D', generating a negative voltage (equal to the voltage at D' minus the voltage at C') on the bit line which is stored in S&H 222.

In this alternate embodiment, comparator 238 first adds the two voltage signals stored in S&H 220 and 222, and then compares the resulting voltage with a small, negative reference voltage. If the combined S&H signals produce a voltage that is more negative than the reference voltage, the cell is read as a "0" bit; otherwise the cell is read as a "1" bit. It should be noted that the comparator 238 is still comparing the contents of the first S&H 220 with the contents of the second S&H 222, but in this embodiment the form of the comparison is as follows: "is the magnitude of the voltage in the first S&H 220 significantly less than the magnitude of the voltage in the second S&H 222 (i.e., is it smaller by at least a predefined theshold amount)?" If so, the cell is storing a "0", otherwise it is storing a "1."

This alternate embodiment has the advantage that each and every read cycle goes around the entire hysteresis loop regardless of whether the cell stores a "0" or a "1" value, and thus results in more uniform handling of memory cells. It also allows the use of shorter the time delays $\Delta T1$, $\Delta T2$, and $\Delta T3$ discussed above, because it is easier to distinguish between "0" and "1" cells using this alternate embodiment.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A ferroelectric random access memory, comprising:
    at least one column of ferroelectric memory cells, each column of memory cells coupled to a distinct bit line, each memory cell being selectively coupled to said corresponding bit line by an access control transistor so that only one memory cell in said column is coupled to said bit line at a time;
    control means, coupled to said array of memory cells, for strobing a selected memory cell in said at least one column of memory cells a first time, and then waiting for a predefined period of time before strobing the same selected memory cell a second time; wherein each said strobing of said selected memory cell produces a resulting voltage signal on said bit line coupled to said selected memory cell;
    a sense amplifier coupled to said bit line and said control means, said sense amplifier including a first sample and hold circuit which samples and holds a data voltage level on said bit line resulting from said first strobing of said selected memory cell, a second sample and hold circuit which samples and holds a reference voltage level on said bit line resulting from said second strobing of said selected memory cell, and a differential amplifier which compares said data voltage level stored in said first sample and hold circuit with said reference voltage level stored in said second sample and hold circuit and generates an output bit value based on said comparison.

2. The ferroelectric random access memory of claim 1, wherein said differential amplifier which outputs a first bit value when the data voltage level held in said first sample and hold circuit exceeds the reference voltage level held in said second sample and hold circuit by at least a predefined threshold and which otherwise outputs a second bit value which is the inverse of said first bit value.

3. The ferroelectric random access memory of claim 1, wherein said first sample and hold circuit samples said data voltage level on said bit line a first predefined amount of time after said first strobing of said selected memory cell, said second sample and hold circuit samples said reference voltage level on said bit line a second predefined amount of time after said second strobing of said selected memory cell, said first predefined amount of time being at least twice as long as said second predefined amount of time;
    whereby said predefined amounts of time are selected so as to reduce said data voltage level relative to said reference voltage level.

4. The ferroelectric random access memory of claim 1, wherein said memory includes means for setting said bit line to a predefined voltage prior to each strobing of said selected memory cell.

5. A ferroelectric random access memory, comprising:
    an array of ferroelectric memory cells arranged in rows and columns, each column of memory cells being coupled to a distinct bit line, each memory cell being selectively coupled to said corresponding bit line by an access control transistor so that only one memory cell in said column is coupled to said bit line at a time;
    at least one sense amplifier coupled to one of said bit lines, said sense amplifier including first and second sample and hold means for sampling and holding a voltage level on said bit line, and a differential amplifier which outputs a first bit value when the voltage level held in said first sample and hold means exceeds the voltage level held in said second sample and hold means by at least a predefined threshold and otherwise outputs a second bit value which is the inverse of said first bit value; and
    control means, coupled to said array of memory cells and said at least one sense amplifier, for strobing a selected memory cell a first time, storing a resulting data voltage level on the bit line coupled to said selected memory cell in said first sample and hold means of said sense amplifier, then strobing said selected memory cell a second time, storing a resulting reference voltage level on the bit line coupled to said selected memory cell in said second sample and hold means of said sense amplifier, and then enabling said differential amplifier so as to generate an output bit value.

6. The ferroelectric random access memory of claim 5, wherein said first sample and hold means samples said data voltage level on said bit line a first predefined amount of time after said first strobing of said selected memory cell, said second sample and hold means samples said reference voltage level on said bit line a second predefined amount of time after said second strobing of said selected memory cell, said first predefined amount of time being at least twice as long as said second predefined amount of time;
    whereby said predefined amounts of time are selected so as to reduce said data voltage level relative to said reference voltage level.

7. The ferroelectric random access memory of claim 5, wherein said memory includes means for setting said bit line to a predefined voltage prior to each strobing of said selected memory cell.

8. A method of operating a ferroelectric random access memory, said memory containing an array of ferroelectric memory cells arranged in columns, each column of memory cells being coupled to a distinct bit line, each memory cell being selectively coupled to said corresponding bit line by an access control transistor so that only one memory cell in said column is coupled to said bit line at a time; the steps of the method comprising:
    selecting a memory cell in at least one of said columns of memory cells by enabling said memory cell's access control transistor and thereby coupling said selected memory cell to a bit line;
    strobing said selected memory cell so as to produce a data voltage level on said bit line indicative of data stored in said selected memory cell;
    sampling and holding said voltage level on said bit line in a first sample and hold circuit;
    strobing said selected memory cell a second time so as to produce a reference voltage level on said bit line indicative of device characteristics of said selected memory cell;
    sampling and holding said reference voltage level on said bit line in a second sample and hold circuit;

comparing said data voltage level stored in said first sample and hold circuit with said reference voltage level stored in said second sample and hold circuit, and generating an output bit value based on said comparison.

9. The method of operating a ferroelectric random access memory set forth in claim 8, said comparing and generating steps generating a first bit value when the data voltage level held in said first sample and hold circuit exceeds the reference voltage level held in said second sample and hold circuit by at least a predefined threshold and otherwise outputs a second bit value which is the inverse of said first bit value.

10. The method of operating a ferroelectric random access memory set forth in claim 8, wherein said first sampling step is performed a first predefined amount of time after said first strobing step; said second sampling step is performed a second predefined amount of time after said second strobing step; said first predefined amount of time being at least twice as long as said second predefined amount of time;

whereby said predefined amounts of time are selected so as to reduce said data voltage level relative to said reference voltage level.

11. The method of operating a ferroelectric random access memory set forth in claim 8, further including the step of setting said bit line to a predefined voltage prior to each said strobing step.

* * * * *